Nov. 20, 1956 J. F. BELL ET AL 2,771,547

MULTIBAND FREQUENCY SELECTOR AND FREQUENCY CONVERTER

Filed Aug. 5, 1955 5 Sheets-Sheet 1

JOHN F. BELL
ROGER M. NORDBY
*INVENTORS.*

BY John J. Pederson

THEIR ATTORNEY.

MULTIBAND FREQUENCY SELECTOR AND FREQUENCY CONVERTER

Filed Aug. 5, 1955 5 Sheets-Sheet 2

JOHN F. BELL
ROGER M. NORDBY
*INVENTORS.*

BY John J. Pederson

THEIR ATTORNEY.

JOHN F. BELL
ROGER M. NORDBY
*INVENTORS.*

BY John J. Pederson

THEIR ATTORNEY.

MULTIBAND FREQUENCY SELECTOR AND FREQUENCY CONVERTER

Filed Aug. 5, 1955

JOHN F. BELL
ROGER M. NORDBY
*INVENTORS.*

BY John J. Pederson

THEIR ATTORNEY.

JOHN F. BELL
ROGER M. NORDBY
*INVENTORS.*

BY John J. Pederson
THEIR ATTORNEY.

United States Patent Office 2,771,547

Patented Nov. 20, 1956

2,771,547

MULTIBAND FREQUENCY SELECTOR AND FREQUENCY CONVERTER

John F. Bell, Glenview, and Roger M. Nordby, Evanston, Ill., assignors to Zenith Radio Corporation, a corporation of Illinois Application August 5, 1955, Serial No. 526,710

8 Claims. (Cl. 250—20)

This invention is directed to a new and improved frequency-selective device for tuning a television receiver to each of a plurality of different frequency channels; more specifically, it is concerned with a tuner capable of adjusting a television receiver for operation within three different frequency ranges each of which includes several different operating frequencies.

With the advent of broadcasting in the ultra-high frequency range, the already complex problems presented in constructing frequency-selective input circuits for television receivers have been materially increased. In effect, a television receiver intended to operate on all available channel frequencies must now function at each of a plurality of different signal frequencies located within three different frequency ranges. These frequency ranges are the low V.H.F. band (54 to 88 megacycles, channels 2–6, the high V.H.F. band (174–216 megacycles, channels 7–13) and the U.H.F. band (470–890 megacycles, channels 14–83). A wide variety of turret, bandswitch, and continuous tuning devices have been employed for this purpose, all of which have been objectionable to at least some extent from the standpoint of complexity of structure and/or operation. For example, in many television receivers intended to cover the entire range of television operating frequencies, two separate and complete tuners are employed; one of the channel selectors covers the two V.H.F. ranges and the other is employed in the U.H.F. range. Frequently, in these arrangements, a turret or bandswitch tuner is employed for the low and middle frequency ranges and a continuous-type tuning device is utilized for the high frequency range. These arrangements invariably require the use of at least two tuning controls by the set owner, which is undesirable in view of the fact that most users demand the utmost of simplicity in receiver controls. Furthermore, most of the prior art arrangements have resulted from the forced combination of units designed for independent operation and consequently have required substantial compromises in performance.

It is an object of the invention, therefore, to provide a frequency-selective device for tuning a television receiver over the entire television frequency spectrum in which control functions are reduced to an absolute minimum.

It is a further object of the invention to provide a television receiver tuner operable over all three of the television frequency ranges which may be actuated directly and completely from a single control shaft.

It is another object of the invention to provide a simplified television receiver tuner which automatically changes antenna connections simultaneously with predetermined changes in the frequency setting of the tuner.

It is a corollary object of the invention to provide a television tuner operable over the entire television frequency spectrum in which the tuner circuitry and structure are markedly simplified and consequently reduced in cost.

A frequency-selective device for tuning a television receiver to each of a plurality of different frequency channels located within a low frequency range, a middle frequency range, and a high frequency range, constructed in accordance with one aspect of the invention, comprises an electrical signal-translating network including an amplifier, a first oscillator, a first mixer circuit, a second oscillator, and a second mixer circuit. First tunable circuit means are provided to adjust the amplifier, first oscillator, and first mixer circuits for operation within the low frequency range, and second tunable circuit means are employed to adjust the same circuits for operation within the middle frequency range. Third tunable circuit means are utilized to adjust the second oscillator and second mixer for operation within the high frequency range and to adjust the amplifier and first mixer circuits for operation as amplifiers at a predetermined intermediate frequency. Switching means are provided for selectively individually intercoupling the three different tunable circuit means with the signal-translating network and a unicontrol mechanism, operated by continuous rotation of a single shaft, is employed to actuate the switching means and to tune each of the tunable circuit means in predetermined sequence to condition the signal-translating network for operation throughout the three frequency ranges.

It is an additional object of the invention to provide a frequency-selective device for a television receiver which substantially reduces radiation at oscillator frequencies.

In another aspect, the invention is directed to a heterodyning stage for use in a frequency selective apparatus employed to tune a television receiver to any of a plurality of different frequency channels located within a predetermined frequency range. The heterodyning stage comprises an oscillator circuit including a pair of output terminals and a mixer circuit comprising an asymmetrically conductive device and an output lead coupled to that device. The heterodyning stage further includes coupling means for electrically coupling the oscillator circuit to the mixer circuit; this coupling means comprises a conductive feed-through capacitor member encompassing a predetermined portion of the mixer circuit output lead, the opposite ends of the feed-through capacitor member being individually coupled to respective output terminals of the oscillator.

The features of the invention which are believed to be novel are set forth with particularity in the appended claims. The organization and manner of operation of the invention, together with further objects and advantages thereof, may best be understood by reference to the following description taken in conjunction with the accompanying drawings, in which like elements are identified by like numerals in each of the figures, and in which:

Figure 1:
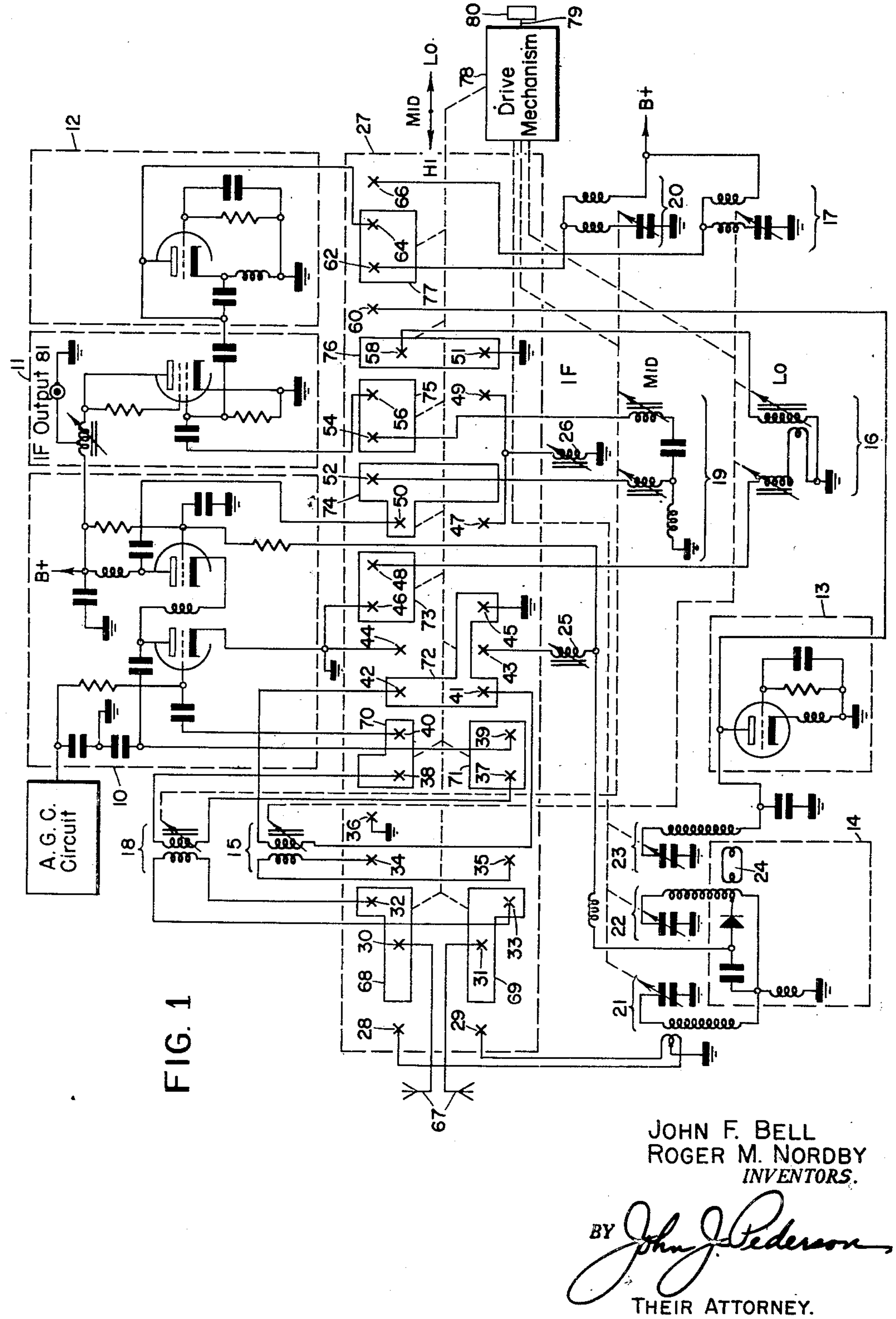
Figure 1 is a schematic diagram of a frequency-selective tuning device for a television receiver constructed in accordance with one embodiment of the invention.

The circuit diagram of Figure 1 shows the complete frequency-selection apparatus, from antenna to intermediate-frequency amplifier, of a television receiver adapted to operate at any of the operating frequencies presently employed for television broadcasting. The tuning device comprises an electrical signal-translating network including a cascode amplifier enclosed within dash outline 10, a first mixer circuit included within dash outline 11, and a first oscillator comprising the elements encompassed by dash line 12. Circuits 10, 11 and 12 comprise the basic operating circuits for the low and middle frequency ranges, as will be explained more completely hereinafter. The signal-translating network of Figure 1 includes a second oscillator circuit 13 and a second mixer circuit 14, which, in conjunction with amplifier 10 and mixer 11, are utilized for operation in the UHF or high frequency range.

The tuner circuit of Figure 1 further includes first tunable circuit means for adjusting amplifier 10, mixer 11, and oscillator 12 for operation within the low frequency range (54–88 mc.). This first tunable circuit means comprises a tunable input transformer 15, a tunable coupling circuit 16 which may be employed to couple amplifier 10 to mixer 11, and an oscillator tuning circuit 17 which may be coupled to oscillator 12 to adjust it for operation in the low frequency range. In this preferred embodiment, input circuit 15 and coupling circuit 16 are tuned by varying their effective inductance, whereas capacitive tuning is employed in oscillator circuit 17. The tuner further includes second tunable circuit means to condition amplifier 10, mixer 11 and oscillator 12 for operation in the middle frequency range (174–216 mc.). This second group of tunable circuit elements comprises a tunable input transformer 18, a tunable coupling circuit 19, and a tunable oscillator circuit 20.

The tuner also includes third tunable circuit means for adjusting oscillator 13 and mixer 14 for operation within the high frequency or UHF range and for conditioning amplifier 10 and mixer 11 for operation as amplifiers at the intermediate frequency of the receiver (usually 41 or 21 megacycles). This third tunable circuit means comprises a preselector circuit 21, a mixer tuning circuit 22, and an oscillator tuning circuit 23. Tunable elements 21 and 22 are coupled to mixer circuit 14 and tunable element 23 is coupled to oscillator 13; a coupling loop 24 intercouples the oscillator and mixer circuits. In addition, an adjustable tuning coil 25 is coupled to mixer circuit 14 and is adapted to be connected to the input of amplifier 10; a similar adjustable tuned element 26 is provided for coupling amplifier 10 to mixer 11. The variable inductance elements 25 and 26 are utilized to condition circuits 10 and 11 for operation as intermediate-frequency amplifiers in the television receiver.

The three tunable circuit means comprising elements 15—17, 18—20, and 21—26 are obviously not intended for simultaneous use in the frequency-selective device; rather, they are employed at different times to tune the receiver to different bands. Consequently, it is necessary to provide means for selectively individually intercoupling the tunable circuit means with the basic circuits of the signal-translating network. This switching means comprises a single sliding-type switch 27. Switch 27 includes a substantial number of fixed contacts designated by numerals 28–66 which are individually electrically coupled to various points in the tuner circuit, to the different tunable circuit elements, and to points of reference potential (ground and/or the receiver B+ supply). Thus, contacts 28 and 29 are coupled to preselector circuit 21, contacts 30 and 31 are connected to an antenna 67, contacts 32, 33 are connected to the primary of input transformer 18, and contacts 34, 35 are connected to the primary of preselector circuit 15. Stationary contact 36 is grounded. Contacts 37 and 38 comprise the terminals for the secondary of input transformer 18, and contacts 39 and 40 are coupled to the plate and grid circuits respectively of the first stage of cascode amplifier 10. Contacts 41 and 42 comprise the secondary terminals of input transformer 15. Contacts 44, 45 and 46 are all grounded, whereas contact 43 is coupled to I. F. tuning coil 25. Contacts 48 and 58 comprise the terminals of tunable coupling circuit 16, contacts 52 and 54 comprise the terminals of tunable coupling circuit 19, and contacts 47 and 49 constitute the terminals of the tunable coupling circuit comprising I. F. coil 26. Stationary contact 50 comprises the output terminal of amplifier 10, whereas contact 56 is the input terminal for mixer circuit 11. Contact 51 is grounded, contact 60 is coupled to the plate circuit of oscillator 13, contact 62 is coupled to oscillator tuning circuit 20, and fixed contact 66 is coupled to oscillator tuning circuit 17. Contact 64 is connected in the plate circuit of oscillator 12.

Switch 27 further includes a number of movable contact elements 68—77 which are employed to interconnect stationary contacts 28—66 to couple the different elements of the three tunable circuit means into the signal-translating network. Movement of movable contacts 68—77 is controlled by a drive mechanism 78 which will be described in detail in connection with Figures 5–8; drive mechanism 78 is also mechanically coupled to the tunable circuit elements comprising circuits 15—23. Drive mechanism 78 is operated by continuous rotation of a single driving shaft 79 controlled from a knob 80, as will be explained more completely hereinafter.

Figure 2:
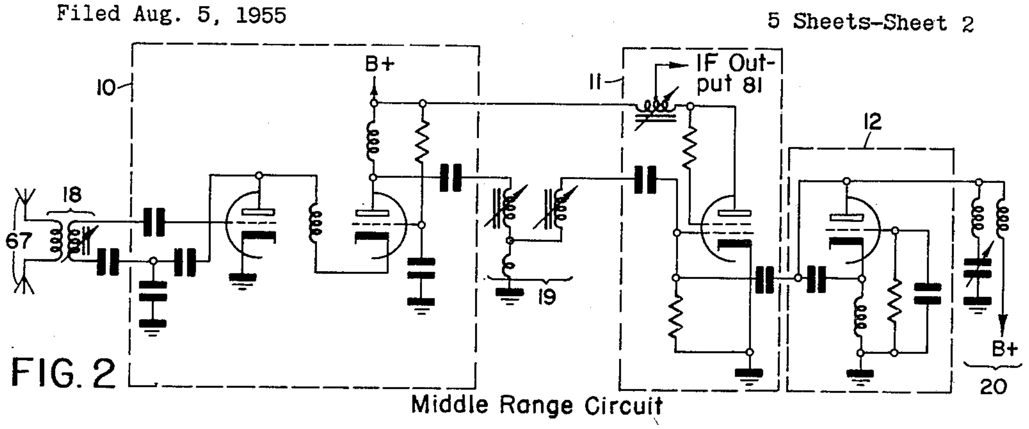
Figure 2 is a simplified diagram of a portion of the apparatus of Figure 1 utilized for operation over a middle frequency range.

There are three basic positions for switching mechanism 27; these three positions correspond to the low, middle and high frequency television ranges. In Figure 1, the switch is shown in the middle frequency range position; that is, with switch 27 in the position shown the signal-translating network of Figure 1 is conditioned for operation in the frequency range of 174 to 216 megacycles. Figure 2 illustrates the effective circuit in simplified form, with the unused portions omitted to simplify explanation of the circuit operation.

When the television receiver in which the tuner of Figure 1 is incorporated is placed in operation, with switch 27 in the middle frequency position, a signal intercepted by antenna 67 is applied through input transformer 18 to cascode amplifier 10. As best shown in the simplified diagram of Figure 2, the received signal is amplified in circuit 10 and is coupled to mixer 11 by means of a tunable coupling circuit 19. At the same time, a heterodyning signal is supplied to mixer 11 from oscillator 12, the frequency of the heterodyning signal being determined by adjustment of tunable circuit 20. An intermediate-frequency output signal is derived from mixer circuit 11, the IF output being indicated by numeral 81.

Figure 3:
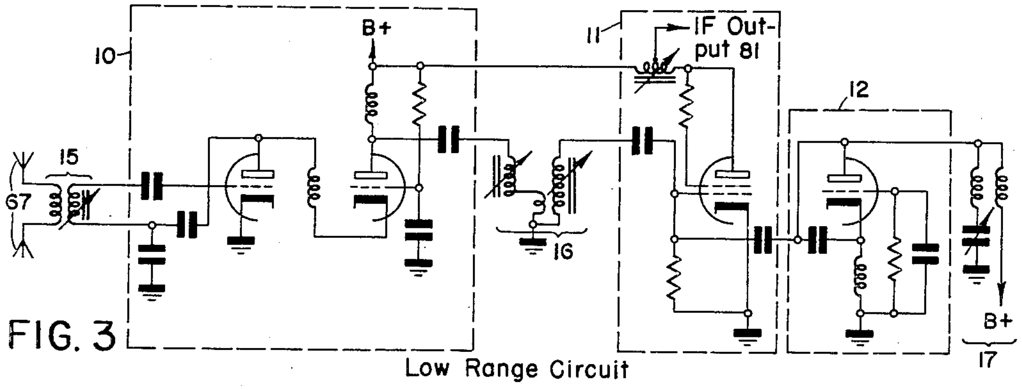
Figure 3 is a simplified schematic diagram of the low frequency range circuit of the tuner of Figure 1.

Switch 27 (Figure 1) may be adjusted by moving contacts 68—77 in the direction indicated by the arrow "LO" to adjust the tuner for operation in the low VHF frequency range. When switch 27 is moved to this position, the effective circuit of the tuner becomes that illustrated in Figure 3. It will be recognized that the circuit of Figure 3 is essentially similar to that of Figure 2 except that the input frequency is determined by tuning transformer 15 instead of preselector 18, coupling circuit 16 replaces coupling circuit 19, and oscillator control circuit 17 is substituted for oscillator tuning section 20. In all other respects, the circuit remains essentially the same and operation is not changed.

Figure 4:
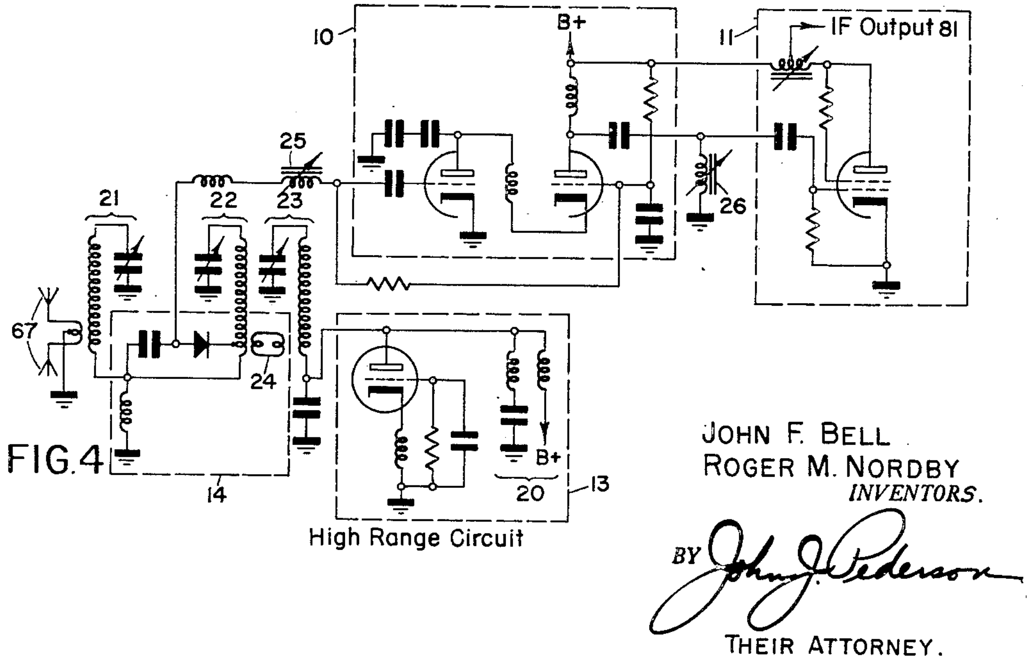
Figure 4 is a simplified schematic diagram of the high frequency range circuit of the tuning device of Figure 1.

Switch 27 of the tuner of Figure 1 may also be moved in the direction indicated by the arrow "HI" to condition the tuner for U. H. F. or high range operation. Antenna 67 is then coupled to preselector 21 to supply the received signal directly to mixer circuit 14. A heterodyning signal is supplied to the mixer circuit from oscillator 13 by means of coupling loop 24. An intermediate-frequency signal is derived from mixer 14 and is supplied to cascode amplifier 10, which is adjusted for intermediate-frequency operation by incorporation of tuned coil 25 in the amplifier circuit. The signal output from amplifier 10 is coupled to mixer circuit 11 by tuned coil 26, which tunes the mixer for operation as a second I. F. amplifier. The basic circuit of Figure 4 is described in considerable detail in the copending application of Arvid E. Chelgren et al., Serial No. 227,834, filed May 23, 1951, now Patent No. 2,726,334 granted December 6, 1955 and assigned to the same assignee as the present invention.

Figure 5:
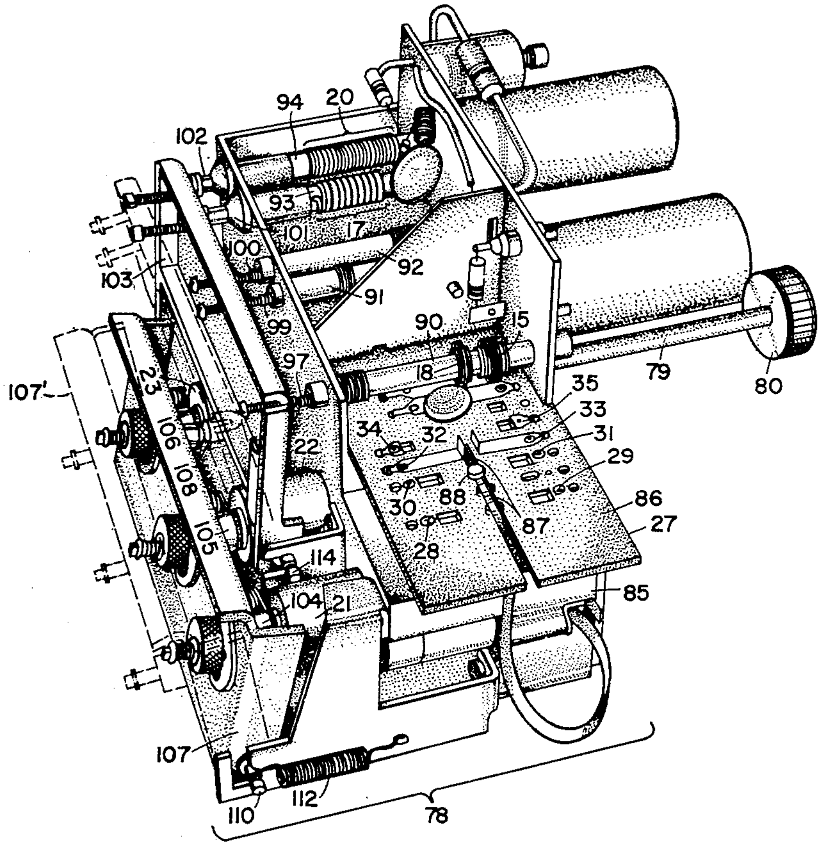
Figure 5 is a composite perspective view showing structural details of a tuner embodying the circuitry of Figure 1 and illustrating operation in each of the three frequency ranges.

The perspective view of Figure 5 shows the structural details of drive mechanism 78 and the rest of the tuner of Figure 1. The tuner comprises a stationary frame 85 upon which switch 27 is mounted; switch 27 includes a stationary support member 86 preferably formed from phenolic resin or other suitable insulating material upon which stationary contacts 28—66 are mounted. Switch 27 further includes a slider member 87 suspended from stator 86 by means of a retainer 88, upon which movable contacts 68—77 (not shown in this view) are mounted.

All of the V. H. F. and I. F. tuning coils are mounted above switch 27. Thus, a first coil form 90 supports the coils of input transformers 15 and 18 in coaxial relation with respect to each other. A second coil form 91 is employed to support the first two coils of coupling stages 16 and 19 in coaxial relation with one another, and another coil form 92 supports the second two coils of the two coupling stages. A separate coil form 93 is utilized to support oscillator tuning section 17, whereas an additional coil form 94 supports oscillator tuning coils 20.

Each of coil forms 90—94 also supports a tuning element for adjusting the frequency response characteristics of the coils supported by that form. Thus, coil form 94 encompasses a conductive tuning slug (not shown) which is utilized to tune the coil of circuit 20 capacitively in the manner described in U. S. Patent No. 2,595,764 to A. E. Chelgren. Similarly, a conductive slug is employed within coil form 93 to obtain capacitive tuning of oscillator tuning circuit 17.

Figure 6:
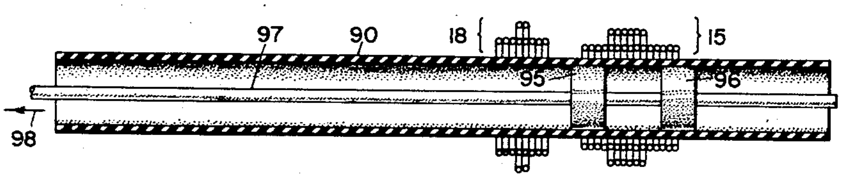
Figure 6 is a cross-sectional view of one of the tunable elements of the tuner.

The tuning system employed for the coils of tuning elements 15, 16, 18 and 19 is somewhat different, and may best be understood by reference to the detailed section view of Figure 6. As indicated therein, the windings of input transformers 15 and 18 are spaced from each other along coil form 90, which preferably comprises ceramic tubing or other high-dielectric insulator material. Two different tuning slugs are mounted within coil form 90; they comprise an iron or other magnetic slug 95 and a conductive tuning element 96 which may be formed from copper, brass, or other similar material. Tuning slugs 95 and 96 are mounted in spaced relation to each other along a common support rod 97. To tune input transformer 15, support rod 97 is moved in the direction indicated by arrow 98, gradually decreasing the amount of magnetic material within the transformer secondary and subsequently introducing conductive material comprising slug 96 into the transformer. Continued movement of support rod 97 in the same direction creates the same tuning effect with respect to the secondary winding of input transformer 18. Preferably, the secondary winding of transformer 15 is adjusted to provide the desired inductance for operation at the middle of the low frequency band without any tuning elements being located within the coil; thus, tuning slugs 95 and 96 are each required to tune the transformer secondary across only one-half the low frequency range. Similarly, the secondary of transformer 18 is selected to have the proper inductance value for operation at the midfrequency of the upper V. H. F. band, thereby reducing the frequency changes necessary from each of the tuning elements.

The interstage coupling circuits mounted on coil forms 91 and 92 are substantially similar in construction to the input circuits described in detail in conjunction with Figure 6. Thus, as shown in Figure 5, coil form 91 encompasses a support member 99 which carries two tuning slugs employed to adjust the first coil of each of circuits 16 and 19, whereas the support member 100 located within coil form 92 carries a pair of tuning slugs for adjusting the effective inductance of the second coil of each of the interstage coupling circuits. Tuning element supports 97, 99, and 100 and the two support rods 101 and 102 for the oscillator coils are all engaged by a carriage 103 which, in turn, is mechanically coupled to operating shaft 79 of the tuner. Similarly, the three tuning slugs 104, 105 and 106 employed for capacitive tuning of circuits 21, 22 and 23 are mechanically coupled to a second carriage 107 which, in turn, mechanically engages one end 108 of shaft 79.

Figure 7:
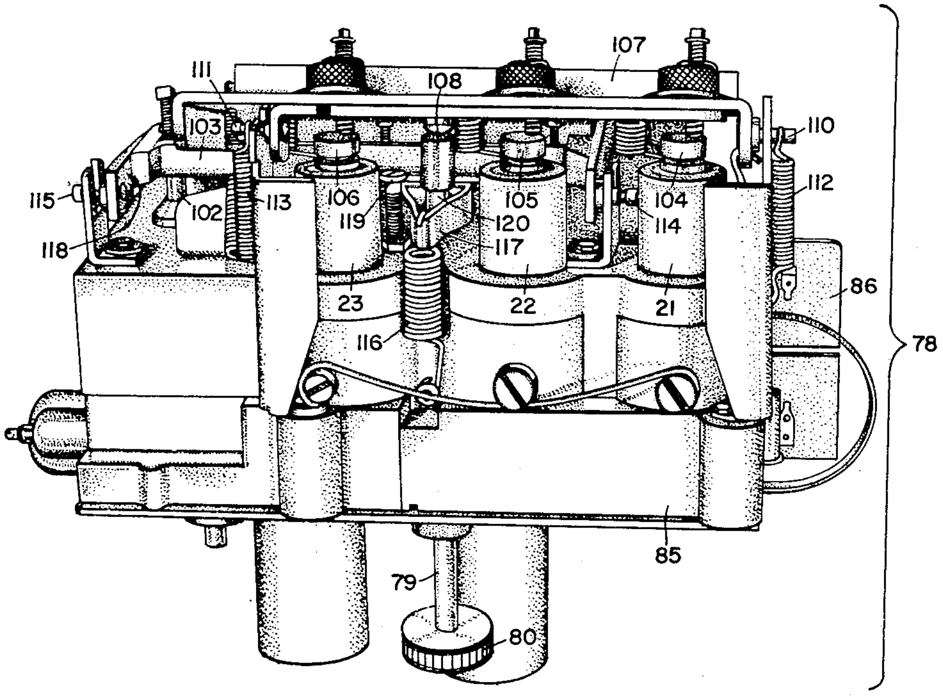
Figure 7 is a bottom view of the tuner illustrated in Figure 5, showing further structural details of the device.

Figure 7 provides a better view of the mechanical coupling between the single operating shaft 79 and the various control elements of the tuner. As shown therein, carriage 107 is pivotally mounted on frame 85 by means of a pair of pivot pins 110 and 111 and is biased into contact with end 108 of shaft 79 by a pair of bias springs 112 and 113. Shaft 79 is threaded into a portion of frame 85 so that rotation of the shaft advances or retracts shaft end 108 and thus varies the position of carriage 107. Movement of the carriage in turn varies the location of tuning slugs 104—106 in relation to U. H. F. tuning elements 21—23 respectively. This mechanical arrangement is essentially similar to that described in detail in the aforementioned copending application of Arvid E. Chelgren et al., Serial No. 227,834.

Carriage 103 is pivotally mounted to frame 85 by means of a pair of pivot pins 114 and 115. A biasing spring 116 is connected to an extension 117 of carriage 103 so that the carriage is urged in the general direction indicated by arrow 118. The carriage travel is limited by a stop member 119, which establishes a maximum upward limit for the carriage movement. Movement of the carriage is effected by a shoulder 120 on shaft 79 which engages carriage extension 117 so that the carriage is constrained to move with the shaft for a portion of the axial shaft movement.

Figure 8:
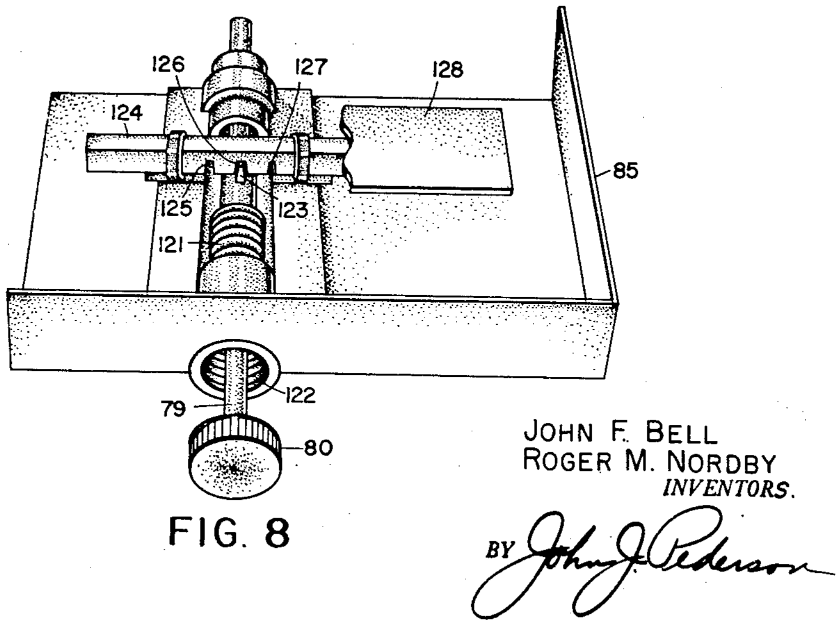
Figure 8 is a perspective view of a switch-actuating mechanism employed in a preferred embodiment of the invention.

The perspective view of Figure 8 illustrates a relatively simple operating mechanism which may be employed to link switch 27 and operating shaft 79. In this arrangement, shaft 79 is threaded into a portion of tuner frame 85, the threaded portions of the shaft and frame being designated by numeral 121 and 122 respectively. Thus, rotation of shaft 79 by manual rotation of knob 80 produces axial movement of the shaft in relation to frame 85. A small key 123 is mounted on shaft 79 at a predetermined location, and an actuating bar 124 is slidably mounted adjacent the portion of shaft 79 upon which the key is located. Actuating bar 124 includes three slots 125, 126 and 127 each having a configuration adapted to engage key 123. A slider or movable switch member 128 is affixed to actuating bar 124 and the movable contacts 68—70 (Figure 1) of switch 27 are mounted on slider 128; the contacts are not shown in Figure 8.

In its illustrated position, the mechanism of Figure 8 is intermediate the operating positions for the low and middle frequency bands. Clockwise rotation of knob 80 and shaft 79 first moves operating bar 124 and shifts switch 27 to the middle-frequency range position. Continued movement of the operating shaft in a clockwise direction traverses carriage 103 through a portion of its operating range to the position shown in dash outline in Figure 5, which represents the limit of the carriage movement. As the shaft revolution is completed, key 123 engages keyway 125 and shifts operating bar 124 of switch 27 to the high frequency position. Continued rotation of shaft 79 in the clockwise direction through a number of revolutions (eight revolutions in the illustrated embodiment) moves carriage 107 through its complete range of operating positions to the position shown by dash outline 107' in Figure 5. On the other hand, starting at the position shown in Figure 8, shaft 79 may be rotated in a counter-clockwise direction to actuate operating bar 124 of switch 27 to the low frequency operating position and continued rotation of the shaft through a full revolution traverses carriage 103 through the portion of its travel allocated to tuning the low-frequency band elements.

The mechanical linkage device illustrated in Figure 8 will be recognized as a species of Geneva movement, and any other similar movement may be employed without departing in any way from the invention. By utilizing a mechanical linkage of this type to actuate the movable elements 124 and 128 of switch 27, complete control of tuner elements 15—23 is combined with control of switch 27 without the use of strings, gears, pulleys, or any similar arrangement which would unduly complicate the tuner structure. The illustrated mechanism avoids the complexities and difficulties of multiple driving linkages by using axial motion of the shaft to control the tuner elements and also correlates that axial movement with rotational shaft movement in controlling master switch 27.

Figure 9:
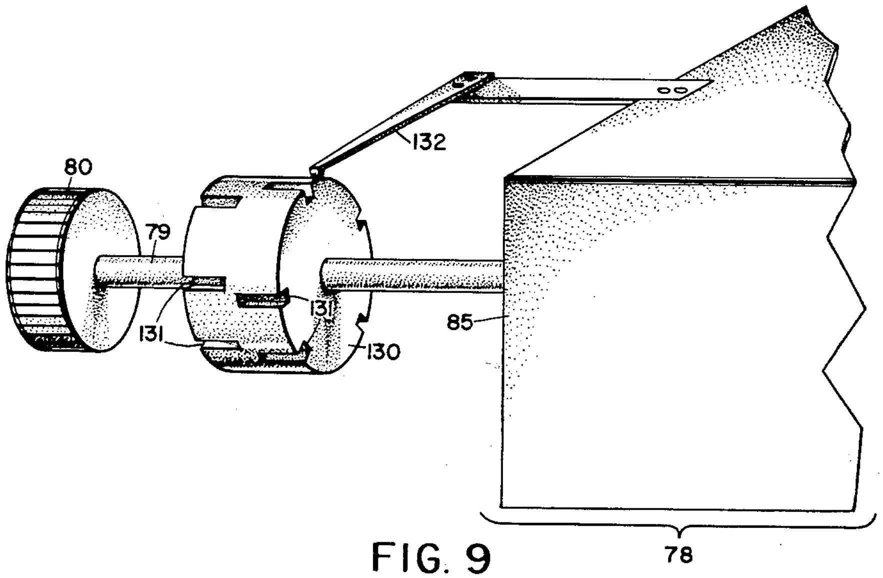
Figure 9 illustrates a detenting mechanism for the tuner of Figures 1–7.

At present, many of the tuners utilized in television receivers are turret or bandswitch types which provide a positive detenting action as the tuner is adjusted from station to station. Consequently, for purposes of public acceptance it may be desirable to provide an indexing or detenting arrangement in connection with drive mechanism 78. One such mechanism is illustrated in Figure 9 and comprises an index drum 130 mounted on shaft 79 for rotational and axial movement therewith. Index drum 130 is provided with a plurality of index slots 131 assigned to the different television channels. The indexing mechanism further comprises a cam follower or index bar 132 mounted on frame 85 of tuner drive mechanism 78. As shaft 80 is rotated, index bar 132 engages the individual channel slots to provide a positive indication whenever the tuner is correctly adjusted to a given television channel. Drum 130, as illustrated, includes only two rows of index slots 131 corresponding to the low and middle frequency operating ranges, but the principle may be extended to additional indexing slots for the UHF channels. The indexing mechanism distinguishes between the slots of different rows in accordance with axial movement of shaft 79, thereby making it possible to provide indexing for any number of channels despite the fact that a number of revolutions of the operating shaft may be necessary to adjust the tuner to all of the various operating frequencies.

Figure 10:
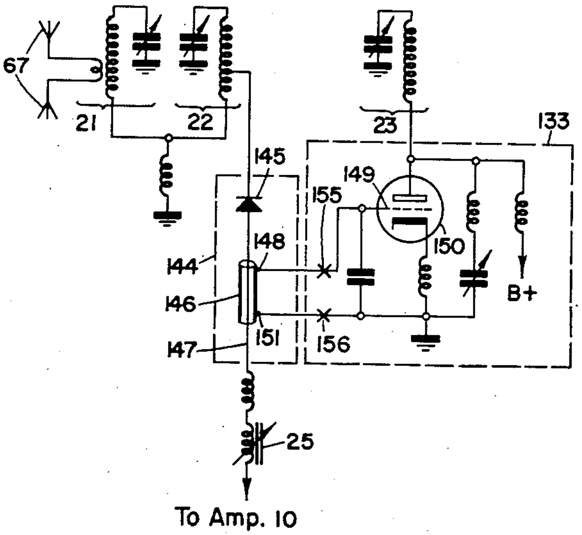
Figure 10 is a schematic diagram of a preferred high-range circuit employed as a part of the invention.

Figure 10 illustrates an improved heterodyning circuit which may be incorporated in the U. H. F. portion of the tuner of Figure 1 and which provides substantially improved operating characteristics. The U. H. F. circuit of Figure 10 is in most respects essentially similar to that of Figures 1 and 4 and comprises an antenna 67 coupled to a preselector circuit 21 which, in turn, is coupled to a tuned circuit 22. The improved circuit further includes an oscillator 133 which is essentially similar in construction to oscillator 13 of Figures 1 and 4 and which is tuned by means of a tunable series L—C circuit 23. The apparatus of Figure 10 also includes a mixer circuit 144 which provides distinct and important advantages as compared to the more conventional circuit 14 of Figures 1 and 4. In mixer circuit 144, a mixer diode 145, usually a germanium crystal diode, is connected to a tap on the coil of mixer circuit 22. The other electrode of diode 145 is connected to a tuned I. F. coil 25 and to amplifier 10 as in the previously-described embodiment. In this circuit, however, coil loop 24 is completely eliminated; instead of the coupling loop, the mixer circuit is coupled to oscillator 133 by means of a feed-through capacitor comprising a conductive tube 146 encompassing and insulated from a portion of the output lead 147 of the mixer diode. One end 148 of the feed-through condenser tube is connected to the grid 149 of the tube 150 in oscillator 133; the other end 151 of the capacitor tube is connected to the oscillator cathode. Viewed more generally, opposite ends 148 and 151 of feed-through capacitor tube 146 are coupled to two output terminals 155 and 156 of oscillator 133. This circuit connection provides inductive coupling to the mixer circuit by utilizing the inductance of the capacitor tube 146 and the corresponding length of conductor 147.

The coupling arrangement illustrated in Figure 10 provides several important advantages. Feed-through capacitor 146 functions as a radio-frequency by-pass condenser to prevent translation of undesired high-frequency components to amplifier 10; at the same time, the capacitor also serve as the matching condenser for the I. F. input circuit comprising coil 25. Moreover, oscillator radiation from antenna 67 is substantially reduced because the entire oscillator input voltage to the mixer circuit appears across that portion of lead 147 encompassed by condenser 146; this input voltage divides between crystal 145 and the coupled portion of mixer tuning circuit 22 with by far the greater portion appearing across the crystal. As as result, oscillator radiation is reduced by as much as four to seven times when compared with the straight-forward coupling loop circuit illustrated in Figures 1 and 4.

While particular embodiments of the present invention have been shown and described, it is apparent that changes and modifications may be made without departing from the invention in its broader aspects. The aim of the appended claims, therefore, is to cover all such changes and modifications as fall within the true spirit and scope of the invention.

We claim:

1. A frequency-selective device for tuning a television receiver to each of a plurality of different frequency channels located within a low frequency range, a middle frequency range, and a high frequency range, said device comprising: an electrical signal-translating network including an amplifier, a first oscillator, a first mixer circuit, a second oscillator, and a second mixer circuit; first tunable circuit means for adjusting said amplifier, said first oscillator, and said first mixer for operation within said low frequency range; second tunable circuit means for adjusting said amplifier, said first oscillator, and said first mixer for operation within said middle frequency range; third tunable circuit means for adjusting said second oscillator and said second mixer for operation within said high frequency range and for adjusting said amplifier and said first mixer for operation as amplifiers at a predetermined intermediate frequency; switching means for selectively individually intercoupling said tunable circuit means with said signal-translating network; and a unicontrol mechanism, operated by continuous rotation of a single shaft, for actuating said switch means and for tuning each of said tunable circuit means in predetermined sequence to condition said signal-translating network for operation throughout said three frequency ranges.

2. A frequency-selective device for tuning a television receiver to each of a plurality of different frequency channels located within a low frequency range, a middle frequency range, and a high frequency range, said device comprising: an electrical signal-translating network including an amplifier, a first oscillator, a first mixer circuit, a second oscillator, and a second mixer circuit; first tunable circuit means for adjusting said amplifier, said first oscillator, and said first mixer for operation within said low frequency range; second tunable circuit means for adjusting said amplifier, said first oscillator, and said first mixer for operation within said middle frequency range; third tunable circuit means for adjusting said second oscillator and said second mixer for operation within said high frequency range and for adjusting said amplifier and said first mixer for operation as amplifiers at a predetermined intermediate frequency; switching means for selectively individually intercoupling said tunable circuit means with said signal-translating network; and a unicontrol mechanism, comprising a single operating shaft coupled to said switching means by a Geneva movement and mechanically linked to said tunable circuit means, for actuating said switching means and for tuning each of said tunable circuit means in predetermined sequence to condition said signal-translating network for operation throughout said three frequency ranges.

3. A frequency-selective device for tuning a television receiver to each of a plurality of different frequency channels located within a low frequency range, a middle frequency range, and a high frequency range, said device comprising: an electrical signal-translating network including an amplifier, a first oscillator, a first mixer circuit, a second oscillator, and a second mixer circuit; first tunable circuit means for adjusting said amplifier, said first oscillator, and said first mixer for operation within said low frequency range; second tunable circuit means for adjusting said amplifier, said first oscillator, and said first mixer for operation within said middle frequency range; third tunable circuit means for adjusting said second oscillator and said second mixer for operation within said high frequency range and for adjusting said amplifier and said first mixer for operation as amplifiers at a predetermined intermediate frequency; switching means for selectively individually intercoupling said tunable circuit means with said signal-translating network; and a unicontrol mechanism, comprising a single operating shaft coupled to said switching means by a Geneva movement to actuate said switching means in predetermined sequence by rotational and axial movement of said shaft, said unicontrol mechanism further comprising a first carriage mechanically coupled to said first and second tunable circuit means and to said shaft and a second carriage mechanically coupled to said third tunable circuit means and to said shaft, both said carriages being actuated by axial motion of said shaft to tune said tunable circuit means in predetermined sequence and condition said signal-translating network for operation throughout said three frequency ranges.

4. A frequency-selective device for tuning a television receiver to each of a plurality of different frequency channels located within a low frequency range, a middle frequency range, and a high frequency range, said device comprising: an electrical signal-translating network including an amplifier, a first oscillator, a first mixer circuit, a second oscillator, and a second mixer circuit; first tunable circuit means for adjusting said amplifier, said first oscillator, and said first mixer for operation within said low frequency range; second tunable circuit means for adjusting said amplifier, said first oscillator, and said first mixer for operation within said middle frequency range; third tunable circuit means for adjusting said second oscillator and said second mixer for operation within said high frequency range and for adjusting said amplifier and said first mixer for operation as amplifiers at a predetermined intermediate frequency; antenna coupling means for coupling said network to an antenna; switching means for selectively individually intercoupling said tunable circuit means with said signal translating network and for coupling said antenna coupling means to a portion of the one of said tunable circuit means currently intercoupled with said network; and a unicontrol mechanism, operated by continuous rotation of a single shaft, for actuating said switching means and for tuning each of said tunable circuit means in predetermined sequence to condition said network for operation throughout said three frequency ranges.

5. A frequency-selective device for tuning a television receiver to each of a plurality of different frequency channels located within a low frequency range, a middle frequency range, and a high frequency range, said device comprising: an electrical signal-translating network including an amplifier, a first oscillator, a first mixer circuit, a second oscillator, and a second mixer circuit; first tunable circuit means for adjusting said amplifier, said first mixer, and said first oscillator for operation within said low frequency range, said first tunable circuit means comprising a first amplifier tuning coil and first mixer tuning coil; second tunable circuit means for adjusting said amplifier, said first mixer, and said first oscillator for operation within said middle frequency range, said second tunable circuit means including a second amplifier coil and a second mixer coil; an amplifier tuning member, common to said first and second tunable circuit means, comprising a highly conductive tuning element and a tuning element of magnetic material, said tuning elements being mounted in spaced relationship with respect to each other for relative movement in relation to said first and second amplifier coils; a mixer tuning member, common to said first and second tunable circuit means, substantially similar in construction to said amplifier tuning member; third tunable circuit means for adjusting said second oscillator and said second mixer for operation within said high frequency range and for adjusting said amplifier and said first mixer for operation as amplifiers at a predetermined intermediate frequency; switching means for selectively individually intercoupling said tunable circuit means with said signal-translating network; and a unicontrol mechanism, comprising a single operating shaft mechanically coupled to said switching means, said tuning members, and said third tunable circuit means, for actuating said switching means and for tuning each of said tunable circuit means in predetermined sequence to condition said network for operation throughout said three frequency ranges.

6. A frequency-selective device for tuning a television receiver to each of a plurality of different frequency channels located within a low frequency range, a middle frequency range, and a high frequency range, said device comprising: an electrical signal-translating network including an amplifier, a first oscillator, a first mixer circuit, a second oscillator, and a second mixer circuit; first tunable circuit means for adjusting said amplifier, said first oscillator, and said first mixer for operation within said low frequency range, said first tunable circuit means comprising variable inductance members for tuning said amplifier and mixer circuits and a variable capacitor member for tuning said first oscillator; second tunable circuit means for adjusting said amplifier, said first oscillator, and said first mixer for operation within said middle frequency range, said second tunable circuit means comprising variable inductance members for tuning said amplifier and first mixer circuits and a variable capacitor member for tuning said first oscillator; third tunable circuit means for adjusting said second oscillator and said second mixer for operation within said high frequency range and for adjusting said amplifier and said first mixer for operation as amplifiers at a predetermined intermediate frequency; switching means for selectively individually intercoupling said tunable circuit means with said signal-translating network; and a unicontrol mechanism, operated by continuous rotation of a single shaft, for actuating said switching means and for tuning each of said tunable circuit means in predetermined sequence to condition said network for operation throughout said three frequency ranges.

7. A frequency-selective device for tuning a television receiver to each of a plurality of different frequency channels located within a low frequency range, a middle frequency range, and a high frequency range, said device comprising: an electrical signal-translating network including an amplifier, a first oscillator, a first mixer circuit, a second oscillator, and a second mixer circuit; first tunable circuit means for adjusting said amplifier, said first oscillator, and said first mixer for operation within said low frequency range; second tunable circuit means for adjusting said amplifier, said first oscillator, and said first mixer for operation within said middle frequency range; third tunable circuit means for adjusting said second oscillator and said second mixer for operation within said high frequency range and for adjusting said amplifier and said first mixer for operation as amplifiers at a predetermined intermediate frequency; switching means for selectively individually intercoupling said tunable circuit means with said signal-translating network, said switching means comprising a substantially planar stationary member, a plurality of primary contacts mounted on said stationary member in predetermined positions and individually electrically connected to predetermined portions of said signal-translating network and said three tunable circuit means, a sliding member mounted for lateral motion in relation to said stationary member, a plurality of secondary contacts disposed upon said movable member in a predetermined pattern and adapted to interconnect selected ones of said stationary contacts; and a unicontrol mechanism, operated by continuous rotation of a single shaft, for actuating and switching means and for tuning each of said tunable circuit means in predetermined sequence to condition said network for operation throughout said three frequency ranges.

8. In a frequency selective apparatus for tuning a television receiver to any of a plurality of different frequency channels located within a predetermined frequency range, a heterodyning stage comprising: an oscillator circuit, including a pair of output terminals; a mixer circuit, including an asymmetrically conductive device and an output lead coupled to said device; and coupling means for electrically coupling said oscillator circuit to said mixer circuit, said coupling means comprising a conductive feed-through capacitor member encompassing a predetermined portion of said output lead of said mixer circuit, the opposite ends of said feed-through capacitor member being individually coupled to respective output terminals of said oscillator.

References Cited in the file of this patent

UNITED STATES PATENTS

| | | |
|---|---|---|
| 1,844,501 | Davis | Feb. 9, 1932 |
| 2,368,694 | Watts | Feb. 6, 1945 |
| 2,469,941 | Abrams | May 10, 1949 |
| 2,665,377 | Krepps | Jan. 5, 1954 |